Aug. 23, 1966 T. MOLLINGA 3,268,828

AMPLIFIER WITH CONSTANT AMPLITUDE OUTPUT

Filed Nov. 2, 1962

INVENTOR.
THOMAS MOLLINGA
BY
Christie, Parker & Hale
ATTORNEYS.

United States Patent Office 3,268,828
Patented August 23, 1966

3,268,828

AMPLIFIER WITH CONSTANT AMPLITUDE OUTPUT

Thomas Mollinga, Sierra Madre, Calif., assignor to Burroughs Corporation, Detroit, Mich., a corporation of Michigan Filed Nov. 2, 1962, Ser. No. 234,970
4 Claims. (Cl. 330—24)

Figure 1:
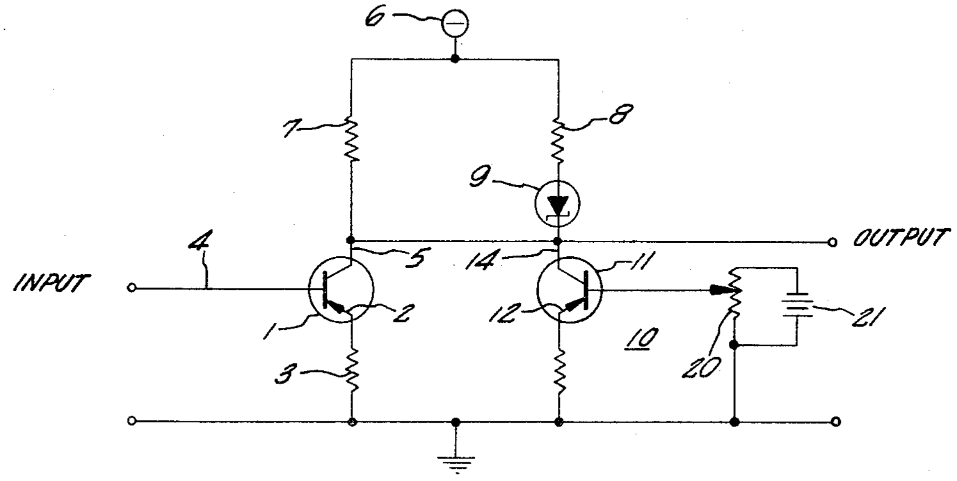

This invention relates to amplifiers having a constant amplitude output signal by direct-current controlled gain, and it is particularly useful as an amplifier in automatic gain control circuits and in constant amplitude signal generators.

In automatic gain control circuits and in constant amplitude signal generators, it is necessary to have an amplifier whose output remains substantially constant regardless of the variations in the strength of the input signal. Amplifiers having constant amplitude outputs have employed many different devices in varying configurations in the past. A typical device employed in such circuits is the variable mu vacuum tube.

Another much used device is the transistor. A typical example of the use of a transistor in a constant amplitude output amplifier is one in which the emitter current is varied to vary the amplification factor of the transistor and to control the input and output impedances thereof. However, in such a circuit, the variations of input and output impedances are also a function of temperature, so that it is sensitive to temperature variations. Additionally, in order to obtain a considerable variation in power gain, the amplifier has to operate from a very small current to a larger current. When operating at a small current, the Ico current (direct-current collector current for zero emitter current) of the transistor becomes a major portion of the current, thus changing the amplification factor of the transistor and introducing distortion.

When the emitter current of the transistor or the grid bias of the variable mu vacuum tube is controlled by the action of a potentiometer or some other manual control, the capacity of the wiring and the internal capacitance of the control device may be very objectionable.

Thus, it is desirable to have an amplifier that will have a constant amplitude output and, at the same time, be substantially insensitive to temperature variations. It is further desirable to have a wide range of variable gain without the introduction of any distortion by the control device.

Therefore, in accordance with the invention, a direct-current control signal is employed to avoid the distortion attributed to manual control. The direct-current control source may also be removed as far as desired from the amplifier without introducing any capacitance into the signal current path. A particularly advantageous way of obtaining direct-current controlled gain of the amplifier is to use an impedance element, which has an impedance that is a function of the current therethrough or the voltage across it.

Therefore, in accordance with the present invention, an amplifier having a constant amplitude output comprises an active element having an output circuit including a variable impedance element and a means for controlling the impedance of the element by varying the current therethrough. A particularly useful variable impedance element for application in a constant amplitude amplifier is a Zener diode, which has a dynamic impedance that varies inversely with the direct-current through it. In conjunction with the Zener diode in the output circuit to vary the gain of the amplifier, there is advantageously provided a constant current generator to supply the variable direct-current for the diode. The constant current generator comprises a transistor as the active element, which is connected in a common-emitter configuration and has a very high output impedance relative to the load impedance of the amplifier. The employment of the common emitter circuit in the current generator makes the control circuit for the diode, in particular, and the amplifier, in general, insensitive to temperature variations.

A further refinement to the constant amplitude output amplifier is the addition of a feedback loop between the output of the amplifier and the control point of the constant current generator. The strength of the direct-current signal applied to the constant current generator through the feedback circuit is made responsive to the signal strength at the output of the amplifier. Thus, the current through the diode from the current generator will be representative of the signal strength at the output of the amplifier and will cause the gain of the amplifier to vary accordingly to effect automatic control and to keep the output signal level constant.

Figure 2:
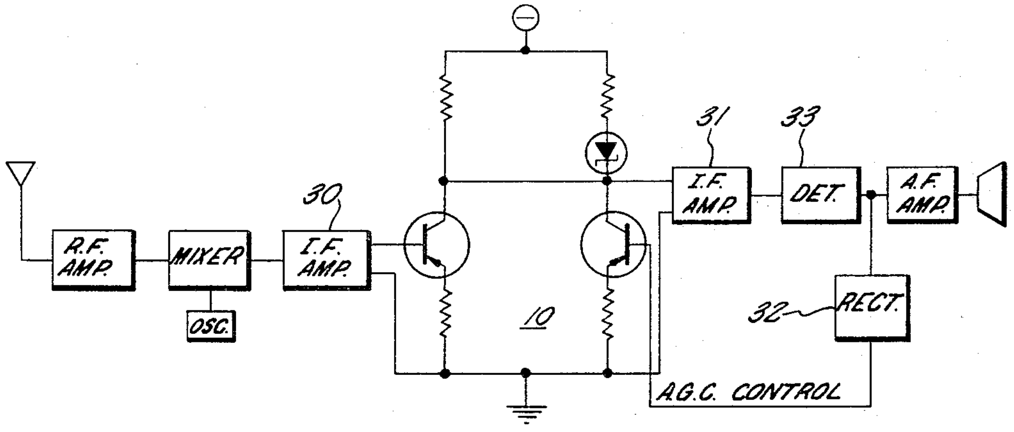

These and other features and advantages of the present invention will be more clearly understood upon consideration of the following specification including the drawing of which:

FIG. 1 is a schematic diagram of a constant amplitude output amplifier, in accordance with the present invention; and FIG. 2 is a diagram, partially in block form, illustrating one application of the constant amplitude output amplifier in an automatic gain control circuit, in accordance with the invention.

The amplifier of FIG. 1 has a transistor 1 as the active element, to amplify the input signals. The transistor 1 is connected in a class A configuration with the emitter 2 connected through a resistor 3 to ground. The base 4 of the transistor is connected to the input signal and the collector 5 is connected to a negative source 6 through the parallel combination of a resistor 7 and a resistor 8 and a Zener diode 9, in series. Thus, the input signal to the amplifier is applied between base 4 of transistor 1 and ground. The output signal is developed across the parallel combination of resistor 7 and the resistor 8 and diode 9, in series.

Thus, it is seen that diode 9 is a variable impedance in the output circuit of the amplifier. The variable impedance of Zener diode 9 therefore determines the amplitude of the output signal of transistor 1. It is known that as the current through a Zener diode is increased, the dynamic impedance thereof will decrease and, vice versa, as the current through the diode is decreased, the dynamic impedance of the diode will increase. Thus, by utilizing this characteristic and supplying a variable current source for the diode, the output impedance of the amplifier may be controlled to produce a constant amplitude output signal.

However, if resistor 7 were removed and resistor 8 were shorted, the only element in the output circuit would be diode 9. Thereafter, if the control current through the diode 9 were at a maximum, the diode would present a very low impedance in the output circuit of the amplifier. This low impedance may be too small to develop an acceptable output signal. Therefore, resistor 8 is provided in series with diode 9. This resistor has a sufficiently low value to permit the impedance of diode 9 to be the dominating factor in the output circuit of the amplifier. Resistor 8 does, however, have a large enough value to develop the output signal when diode 9 is in its low impedance state.

On the other hand, when the control current through the diode is at a minimum and the diode is in its high impedance state, too large a signal may be developed and the voltage at collector 5 of transistor 1 will be effectively equal to the voltage at the emitter 2 of transistor 1 with a resultant saturation of the transistor and distortion of the output signal. Therefore, resistor 7 is connected in parallel with diode 9 to prevent saturation of transistor 1 when diode 9 is in its high impedance state. Thus, the limits of the variable gain of the amplifier are thereafter determined by the values of resistors 7 and 8 rather than the impedance limits of diode 9.

The dynamic impedance of diode 9 is effectively controlled by varying the current therethrough. A constant current generator 10 provides the control current for diode 9 and is connected in the current path of diode 9. The current generator 10 comprises a transistor 11, which is advantageously connected in a common emitter configuration having a high output impedance, which is in parallel with the parallel circuit of resistor 7 and the series circuit of the Zener diode 9 and resistor 8. Because of this relatively high output impedance the current generator may be effectively ignored as far as the output impedance of the amplifier is concerned and thus stability and temperature insensitivity for the amplifier is assured. The transistor 11 has an emitter 12 connected to ground through a resistor 13 and a collector 14 connected to the Zener diode 9 at the junction of the diode and the collector 5 of transistor 1.

The control voltage for the current generator is applied to base 15 of transistor 11. The control voltage may be varied manually as shown in FIG. 1, wherein it is supplied through a voltage divider comprising a resistor 20 and a source 21, or it may be varied automatically, wherein the D.-C. signal represents the magnitude of the amplifier's output signal.

When the control voltage of current generator 10 is varied to increase the current through transistor 11, the current through Zener diode 9 will also be increased. An increase in the current through diode 9 will cause a decrease in the dynamic impedance thereof which produces a decrease in the output impedance of transistor 1. Such a decrease in the output impedance of transistor 1 will cause less output signal to be developed and the amplitude of the output to decrease. Therefore, with proper coordination between the control voltage level of the current generator 10 and the amplitude of the signal input to transistor 1, it is possible to produce a constant amplitude output signal from the amplifier. FIG. 2 shows a circuit wherein such coordination is established.

The circuit of FIG. 2 represents a typical application of a constant amplitude output amplifier as an automatic gain control circuit in a radio receiver. The receiver of FIG. 2 includes the usual amplifiers and detectors in addition to the amplifier of the present invention connected between IF amplifier 30 and IF amplifier 31. The control voltage for current generator 10 is supplied by the output of rectifier 32 which is responsive to the output of detector 33. Thus, the control voltage of the constant amplitude amplifier has a direct relationship to the amplitude of the output signal of the amplifiers preceding the detector 33, including the amplifier of FIG. 1 and automatic gain control of the amplifier results.

I claim:

1. An amplifier with direct-current controlled gain comprising:

(a) a source of direct-current bias voltage;

(b) a source of alternating-current voltage to be amplified;

(c) a stage of amplification having input terminals and output terminals, the stage being biased by the source of bias voltage so as to operate class A;

(d) means connecting the source of alternating-current voltage to the input terminals of the stage of amplification;

(e) a series circuit connected across the source of bias voltage, the series circuit including;

(1) an impedance element, the impedance of which varies inversely as a function of the direct-current passing therethrough;

(2) and a constant current source, the constant current source being responsive to a direct-current control voltage so as to change the direct-current passing through the impedance element.

(f) and means directly connecting one of the output terminals of the stage of amplification to a point in the series circuit between the impedance element and the constant current source, the impedance of the impedance element influencing the output impedance of the stage of amplification.

2. The amplifier of claim 1 in which the series circuit includes a first resistor connected in the series circuit adjacent to the impedance element, the resistance value of the first resistor being sufficiently low to permit the impedance element to influence the output impedance of the stage of amplification and being sufficiently large to permit the development of an output signal when the impedance element is in a low impedance state.

3. The amplifier of claim 2 in which a second resistor is connected between one of the output terminals of the amplifier stage and the source of bias voltage, the resistance of the second resistor being sufficiently small to prevent saturation of the stage of amplification when the impedance element is in a high impedance state.

4. An automatic gain control circuit comprising:

(a) a source of bias voltage;

(b) a first transistor having emitter, base, and collector terminals;

(c) means including a first resistor and the source of bias voltage for biasing the first transistor for class A operation in a common-emitter configuration;

(d) a second transistor having emitter, base, and collector terminals;

(e) a diode;

(f) a second resistor;

(g) means connecting the emitter and collector terminals of the second transistor, the diode, and the second resistor in series across the source of bias voltage;

(h) means directly connecting the collector terminal of the first transistor with the collector terminal of the second transistor to form an amplifier output;

(i) means for developing a direct-current control voltage directly related to the signal strength at the amplifier output;

(j) and means for applying the control voltage to the base of the second transistor in order to control the current flowing between the emitter and collector terminals of the second transistor.

References Cited by the Examiner

UNITED STATES PATENTS

| | | | |
|---|---|---|---|
| 3,066,229 | 11/1962 | Cody | 307—88.5 |
| 3,114,872 | 12/1963 | Allard | 307—88.5 |
| 3,163,827 | 12/1964 | Kandiah. | |
| 3,173,098 | 3/1965 | Peretz | 330—30 X |
| 3,193,702 | 7/1965 | Claessen. | |

ROY LAKE, *Primary Examiner.*

N. KAUFMAN, *Assistant Examiner.*